(12) United States Patent
Dennison

(10) Patent No.: US 7,348,268 B2
(45) Date of Patent: Mar. 25, 2008

(54) CONTROLLED BREAKDOWN PHASE CHANGE MEMORY DEVICE

(75) Inventor: Charles H. Dennison, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 596 days.

(21) Appl. No.: 10/939,237

(22) Filed: Sep. 10, 2004

(65) Prior Publication Data

US 2006/0054996 A1    Mar. 16, 2006

(51) Int. Cl.
*H01L 21/44* (2006.01)

(52) U.S. Cl. .................. 438/597; 438/654; 257/3; 257/4; 257/E21.001

(58) Field of Classification Search ............... 438/597, 438/654; 257/3, 4
See application file for complete search history.

(56) References Cited

U.S. PATENT DOCUMENTS

| 6,512,241 | B1* | 1/2003 | Lai ............................... 257/4 |
| 2003/0001242 | A1* | 1/2003 | Lowrey et al. ............. 257/646 |
| 2005/0018526 | A1* | 1/2005 | Lee ............................ 365/232 |
| 2005/0032319 | A1* | 2/2005 | Dodge ........................ 438/293 |

* cited by examiner

*Primary Examiner*—Zandra V. Smith
*Assistant Examiner*—Christy L Novacek
(74) *Attorney, Agent, or Firm*—Trop, Pruner & Hu, P.C.

(57) ABSTRACT

A phase change memory material may be deposited over an electrode in a pore through an insulator. The adherence of the memory material to the insulator may be improved by using a glue layer. At the same time, a breakdown layer may be formed in the pore between the memory material and electrode.

23 Claims, 10 Drawing Sheets

US 7,348,268 B2

CONTROLLED BREAKDOWN PHASE CHANGE MEMORY DEVICE

BACKGROUND

This invention relates generally to phase change memories.

Phase change memory devices use phase change materials, i.e., materials that may be electrically switched between a generally amorphous and a generally crystalline state, as an electronic memory. One type of memory element utilizes a phase change material that may be, in one application, electrically switched between generally amorphous and generally crystalline local orders or between different detectable states of local order across the entire spectrum between completely amorphous and completely crystalline states.

Typical materials suitable for such an application include various chalcogenide elements. The state of the phase change materials is also non-volatile. When the memory is set in either a crystalline, semi-crystalline, amorphous, or semi-amorphous state representing a resistance value, that value is retained until reprogrammed, even if power is removed. This is because the programmed value represents a phase or physical state of the material (e.g., crystalline or amorphous).

When a potential is applied across the phase change memory, conduction may occur. The greater the volume of phase change material that must be programmed, the greater the programming power requirements. Thus, a breakdown layer may be used which is subject to breakdown at a point between an electrode and the phase change material. Conduction may occur at this breakdown point, reducing the volume of material that needs to change phase.

A so-called glue layer may be used between the phase change material and an underlying insulator. If the breakdown layer intervenes between the glue layer and the phase change material, the glue layer's ability to adhere the phase change layer would be compromised.

Thus, there is a need for alternate ways to form phase change memories with both breakdown and glue layers.

DETAILED DESCRIPTION

Figure 1:
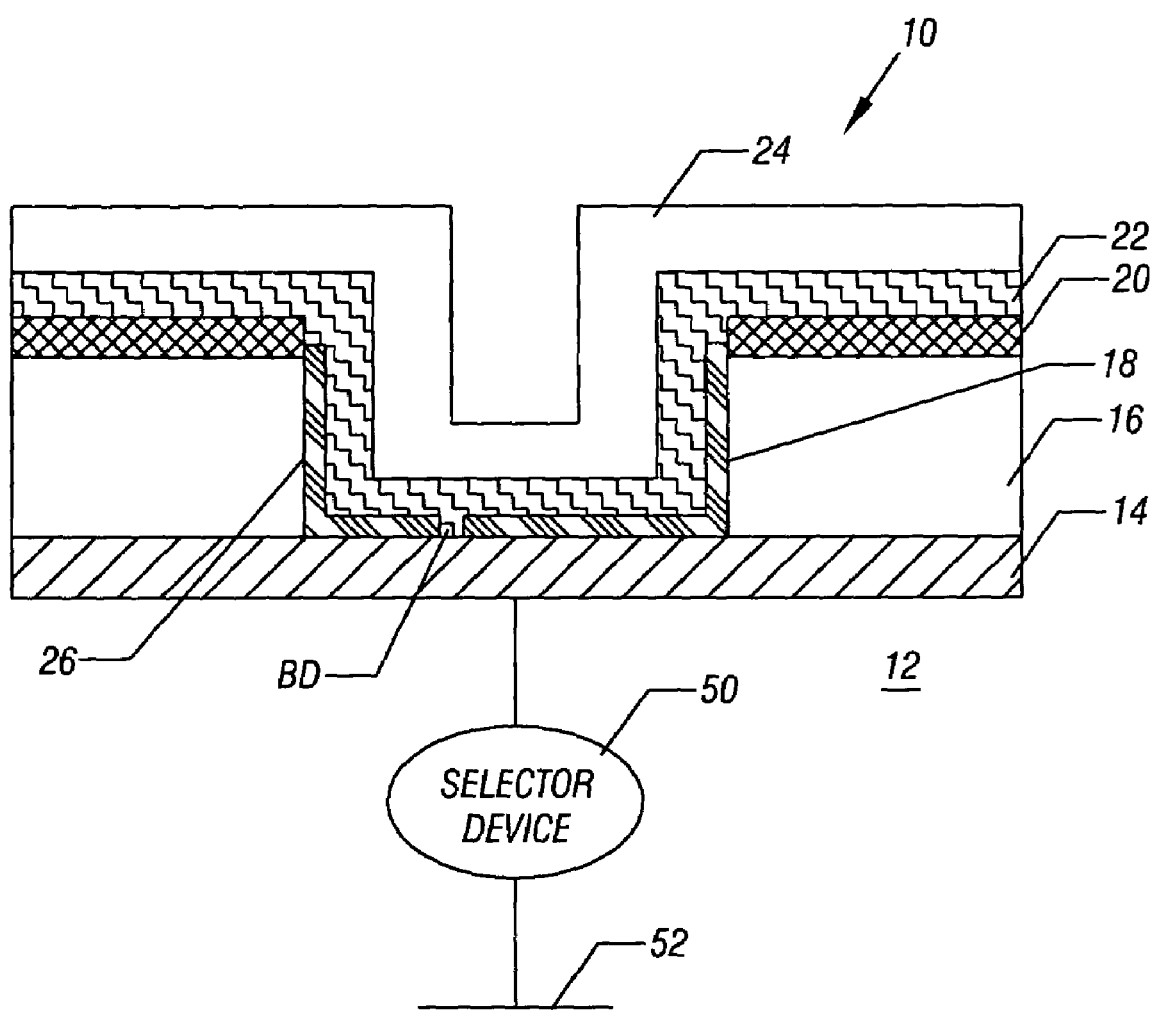
FIG. 1 is a partially schematic and partially cross-sectional view of one embodiment of the present invention.

Referring to FIG. 1, a phase change memory may include a number of cells 10 formed on a semiconductor substrate 12. In one embodiment, the substrate 12 may include a conductive line 52 that may be a row line in one embodiment. The conductive line 52 may be coupled to cells 10 through a selector device 50 in one embodiment. The selector device 50 may, for example, be a diode, a transistor, or an ovonic threshold device. Another conductive line 24, that may be called a column, may run transversely to the line 50 in one embodiment. Thus, an array of cells 10 may be addressably accessed by conductive lines 24 and 52.

The cell 10 may include an insulator 16 having a pore 18 formed therethrough in one embodiment. The insulator 16 may be any dielectric, including oxide. The pore 18 may expose a lower electrode 14 coupled electrically to the selector device 50. Above the electrode 14 may be a thin dielectric breakdown layer 26 that functions to define a local conduction breakdown point. In some cases, the layer 26 may be on the order of 30 Angstroms. Suitable materials for the layer 26 include silicon dioxide, silicon nitride, and aluminum oxide. In one embodiment, the layer 26 is U-shaped, but in other embodiments it may be more planar.

A phase change material 22 may be applied over the breakdown layer 18. A conductive or glue layer 20 may be provided between the phase change material 22 and the insulator 16 to improve the adherence of the phase change layer 22 to the insulator 16. The glue layer 20 may be a conductive material that improves the adherence of the phase change material 22 to the underlying insulator 24. Suitable materials for the glue layer include polysilicon, titanium, and titanium silicon nitride.

The phase change material 22 may be a material having electrical properties (e.g., resistance) that may be changed through the application of energy, such as, for example, heat, light, voltage potential, or electrical current. Examples of a phase change material may include a chalcogenide material or an ovonic material.

An ovonic material may be a material that undergoes electronic or structural changes and acts as a semiconductor when subjected to application of a voltage potential, an electric current, light, heat, etc. A chalcogenide material may be a material that includes at least one element from column VI of the periodic table or may be a material that includes one or more of the chalcogen elements, e.g., any of the elements of tellurium, sulfur, or selenium. Ovonic and chalcogenide material may be non-volatile memory materials that may be used to store information.

In one embodiment, the material 22 may be a chalcogenide element composition of a class of tellurium-germanium-antimony ($Te_xGe_ySb_z$) material or a GeSbTe alloy, although the scope of the present invention is not limited to just these examples. In one embodiment, instead of using a discrete selector device, the material 22 in the form of chalcogenide may be utilized to selectively isolate the memory element.

In one embodiment, if the material 22 is a non-volatile, phase change material, then the memory material 22 may be programmed into one of at least two memory states by applying an electrical signal to the memory material 22. The electrical signal may alter the phase of the material 22 between a substantially crystalline state and a substantially amorphous state, wherein the electrical resistance of the material 22 in the substantially amorphous state is greater than the resistance of the material 22 in the substantially crystalline state. Accordingly, in this embodiment, the material 22 may be adapted to be altered to one of at least two resistance values within a range of resistance values to provide single bit or multi-bit storage of information. In another embodiment, the material 22 may be adapted to be altered to one of at least two threshold voltages to provide single bit or multi-bit storage of information.

Programming of the material 22 to alter the state or phase of the material 22 may be accomplished by applying voltage potentials to the lines 52 and 24, thereby generating a voltage potential across the material 22. An electrical current may flow through a portion of the material 22 in response to the applied voltage potentials and may result in heating of the material 22.

This heating and subsequent cooling may alter the memory state or phase the material 22. Altering the phase or state of the material 22 may alter an electrical characteristic of the material 22. For example, the resistance of the material 22 may be altered by altering the phase of the material 22. The material 22 may also be referred to as a programmable resistive material or simply a programmable material. In another embodiment, the material 22 may be adapted to be altered to one of at least two threshold voltages to provide single bit or multi-bit storage of information.

In one embodiment, a voltage potential difference of about 3 volts may be applied across a portion of the material 22 by applying about 3 volts to the line 24 and about 0 volts to the line 52. A current flowing through the material 22 in response to the applied voltage potential may result in heating of the material 22. This heating and subsequent cooling may alter the memory state or phase the material 22.

In a "reset" state, the material 22 may be in an amorphous or semi-amorphous state and in a "set" state, the material 22 may be in a crystalline or semi-crystalline state. The resistance of the material 22 in the amorphous or semi-amorphous state may be greater than the resistance of the material 22 in the crystalline or semi-crystalline state. The association of "reset" and "set" with amorphous and crystalline states, respectively, is a convention; other conventions may also be adopted.

Due to electrical current, the material 22 may be heated to a relatively higher temperature to amorphisize the material 22 and "reset" memory material 22 (e.g., program the material 22 to a logic "0" value). Heating the volume of material 22 to a relatively lower crystallization temperature may crystallize the material 22 and "set" the material 22 (e.g., program the material 22 to a logic "1" value). Various resistances of the material 22 may be achieved to store information by varying the amount of current flow and the duration through the volume of memory material 22 in some embodiments.

The information stored in the material 22 may be read by measuring the resistance of the material 22. As an example, a read current may be provided to the material 22 using the lines 24 and 52, and the resulting read voltage across the material 22 may be compared against a reference voltage using, for example, a sense amplifier (not shown). The read voltage may be proportional to the resistance exhibited by the cell 10. Thus, a higher voltage may indicate that the material 22 is in a relatively higher resistance state, e.g., a "reset" state; and a lower voltage may indicate that the memory material 22 is in a relatively lower resistance state, e.g., a "set" state.

Conduction between the lines 24 and 52 may be facilitated and localized by the creation of a breakdown "BD" channel in the layer 26. After breakdown, the material 22 may be permanently shorted at the breakdown location "BD" to the electrode 14. When an adequate breakdown voltage is applied across it, the layer 26 breaks down, creating a small conductive channel "BD" through the layer 26 at the location of the breakdown. The layer 26 may vary in thickness and consistency as deposited. Therefore, the breakdown is usually at the thinnest point of the layer 26 or wherever the electric field strength is at its highest.

One advantage of an embodiment of the type shown in FIG. 1 is that the layer 26 may be utilized without interfering with the ability of the glue layer 20 to effectively secure the material 22 to the insulator 16. If the layer 26 were formed before the insulator 16, layer thickness variations may arise due to the variable etching of the layer 26 when the pore 18 is etched.

Figure 2:
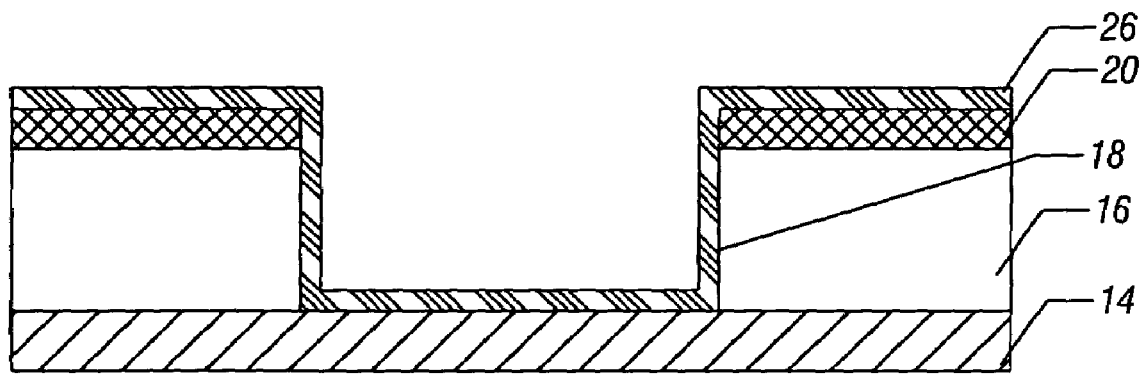
FIG. 2 is an enlarged, cross-sectional view of the embodiment shown in FIG. 1 at an early stage of manufacture.

One technique for forming the structure shown in FIG. 1 may begin with the formation of a pore 18 through the glue layer 20 and an insulator 16 over the bottom electrode 14 in the substrate 12, as shown in FIG. 2. For example, the layer 26 may be blanket deposited. The glue layer 20 may be self-aligned to the pore 18.

Figure 3:
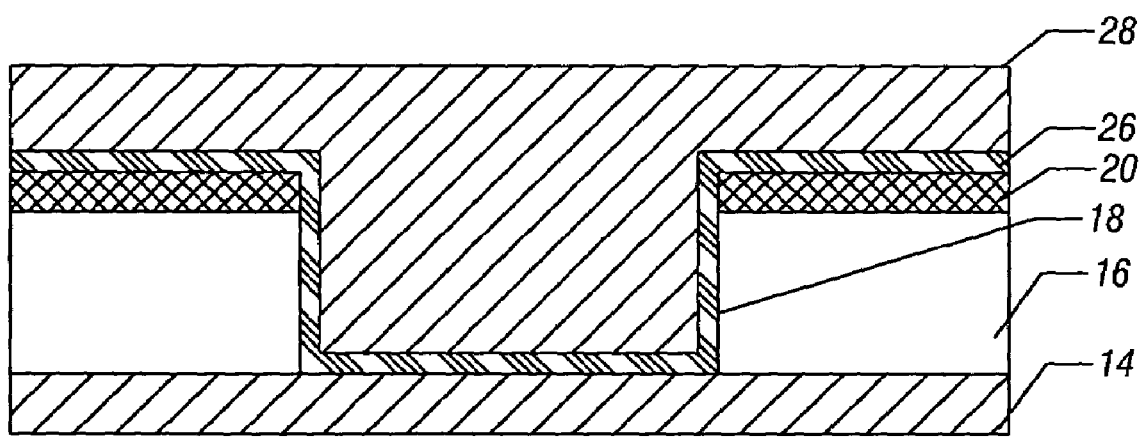
FIG. 3 is an enlarged, cross-sectional view of the embodiment shown in FIG. 2 at a subsequent stage of manufacture in accordance with one embodiment of the present invention.

Subsequently, as shown in FIG. 3, a disposable layer 28 may be formed over the structure shown in FIG. 2. The disposable layer 28 may be spin-coated in one embodiment. An example of the material that may be utilized for the disposable layer 28 is photoresist.

Figure 4:
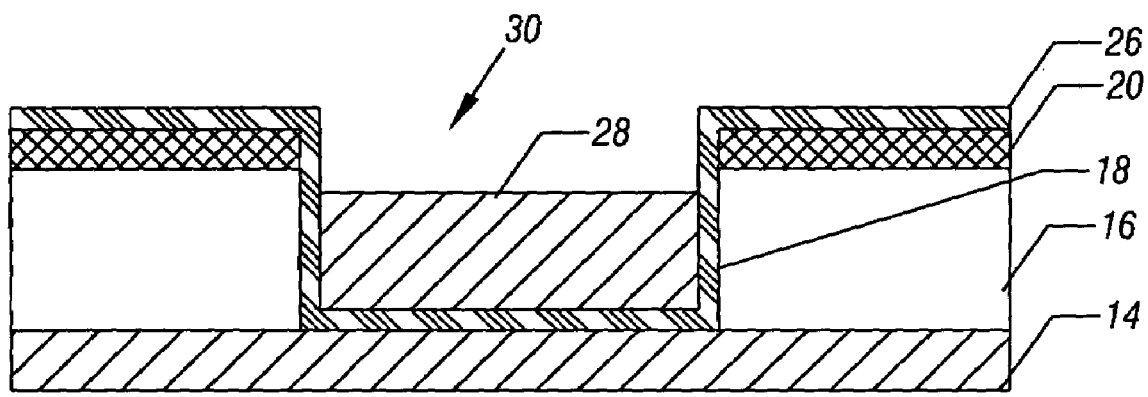
FIG. 4 is an enlarged, cross-sectional view of the embodiment shown in FIG. 3 at a subsequent stage of manufacture.

The portion of the disposable layer 28 over the upper surfaces of the layer 26, as well as a portion of the layer 28 within the pore 18, may be removed to form the structure shown in FIG. 4 with the depressed region 30. Removal and partial removal of layer 28 in this fashion may be done in any conventional fashion, including etching, planarization, wet dip, and wet etch techniques. An etch that is highly selective of the material 28 may be used. Where the layer 28 is photoresist, an $O_2$ plasma etch that is selective of photoresist may be used in one embodiment.

Figure 5:
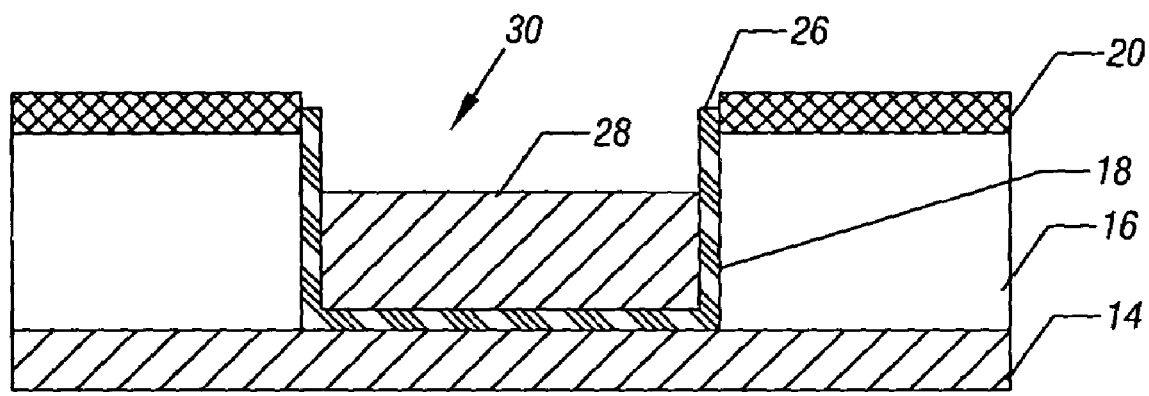
FIG. 5 is an enlarged, cross-sectional view of the embodiment shown in FIG. 4 at a subsequent stage of manufacture in accordance with one embodiment of the present invention.

Referring next to FIG. 5, after the layer 26 has been exposed by removing a portion of the disposable layer 28, the exposed uppermost and horizontal portions of the layer 26 may be removed. At least a part of the vertical portion of the layer 26 may be removed as well in some embodiments. The removal of the layer 28 may be done using wet or dry etching that is selective of the breakdown layer 26. For example, wet resist strips, sulfuric peroxide, or ozone plasma may be used to remove the resist in some embodiments.

Figure 6:
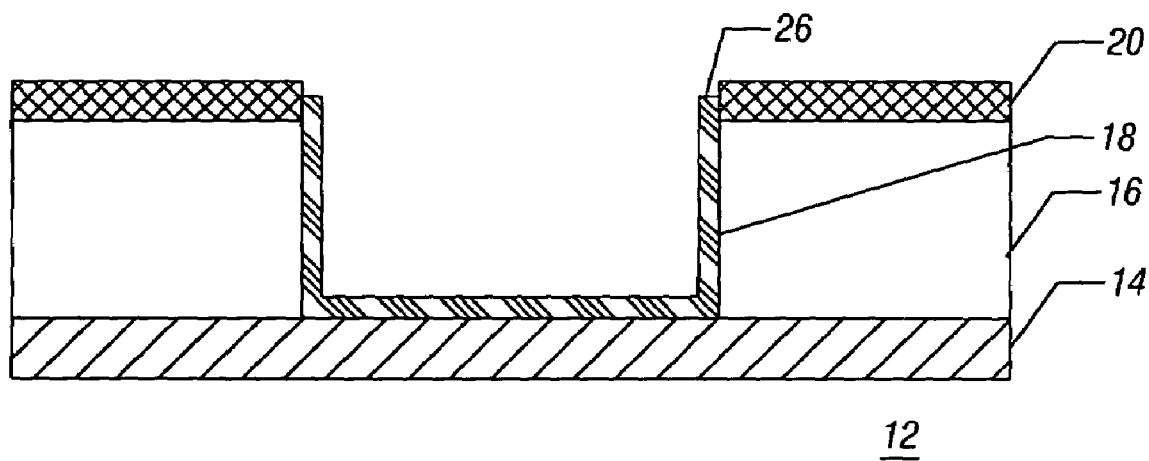
FIG. 6 is an enlarged, cross-sectional view of the embodiment shown in FIG. 5 at a subsequent stage of manufacture in accordance with one embodiment of the present invention.
Figure 7:
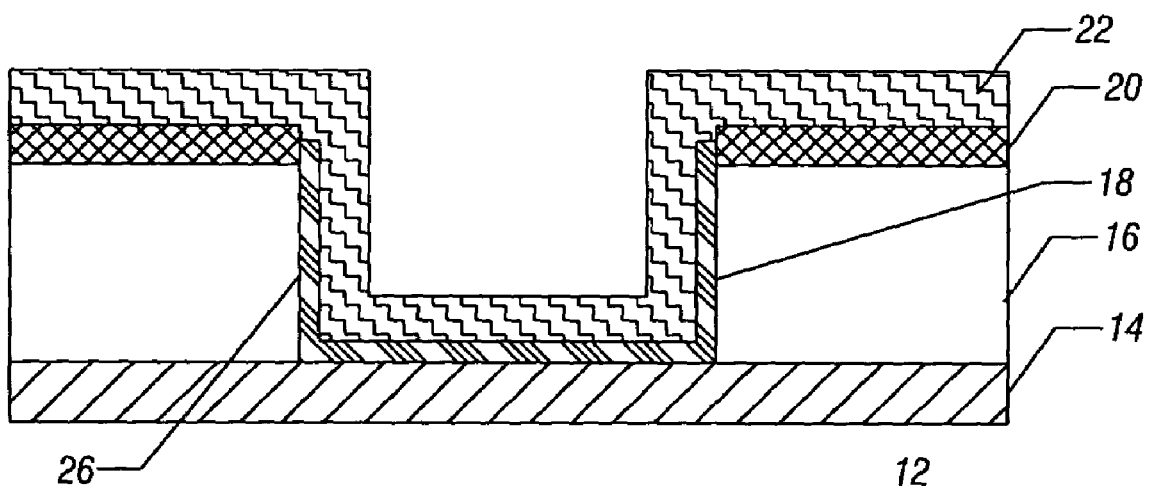
FIG. 7 is an enlarged, cross-sectional view of the embodiment shown in FIG. 6 at a subsequent stage of manufacture in accordance with one embodiment of the present invention.

The remainder of the disposable layer 26 may be removed, as shown in FIG. 6, using a selective etch, in one embodiment. The resulting structure may then be appropriately coated with the material 22, as shown in FIG. 7. The line 24 may be formed over the material 22 to achieve the structure shown in FIG. 1.

The glue layer 20 is still effective since it remains in a position around the pore 18 to assist in adequately adhering the material 22 to the insulator 16. At the same time, the layer 26 may be located in the pore 18 to enable the formation of the breakdown channel.

The adhesion of the layer 28 in the pore 18 and the material 22 deposition may be improved in some situations. For example, with the layer 28 still in the pore 18 as shown in FIG. 4, the wafers may be inserted into an integrated tool such that the following steps can occur in situ without any vacuum break. A sputter etch using argon plasma of the exposed glue layer 20 may be implemented with the breakdown layer 26 still protected from the sputter etch by the layer 28, to achieve the structure of FIG. 5. An ozone plasma strip may be implemented of the layer 28 in the pore 28 to result in the structure of FIG. 6. Then sputter etching may occur prior to material 22 deposition.

Figure 8:
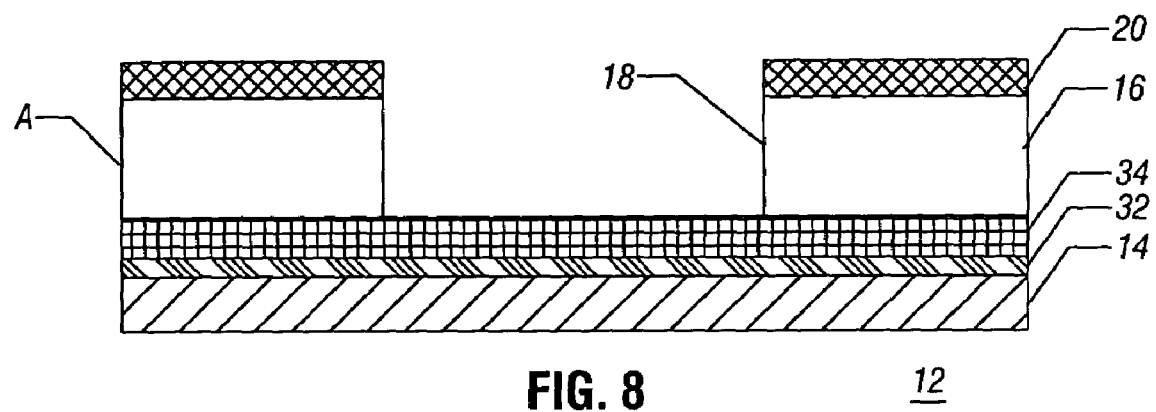
FIG. 8 is an enlarged, cross-sectional view of another embodiment of the present invention.

In accordance with another embodiment of the present invention, a breakdown layer 32 may be deposited over the bottom electrode 14 in a planar fashion, as shown in FIG. 8. The layer 32 may be covered by a disposable etch stop layer 34. The insulator 16 may be formed and covered with the glue layer 20. The pore 18 may then be etched through the insulator 16 and layer 20, down to the etch stop layer 34. In one embodiment, the insulator 16 may be polyimide, and the insulator 16 may be etched with a reactive ion etch using ozone plasma. The etch stop layer 34 may be oxide. The layer 32 may be $Si_3N_4$, $Al_2O_3$, or other suitable materials. As another alternative, the insulator 16 may be oxide and the breakdown layer may be $Al_2O_3$. The particular etchants and materials may be chosen to allow the insulator 16 to be selectively etched without damaging the underlying layer 32 that will be utilized to form the breakdown channel.

Figure 9:
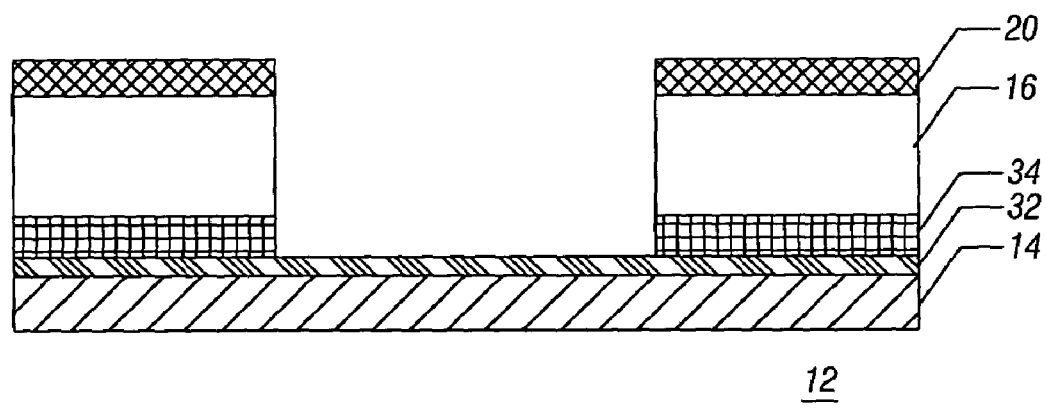
FIG. 9 is an enlarged, cross-sectional view of the embodiment shown in FIG. 8 at a subsequent stage of manufacture in accordance with one embodiment of the present invention.

Referring to FIG. 9, the layer 34 may then be selectively etched, for example using a dilute hydrofluoric acid solution. The glue layer 20 may be provided in an effective position around the pore 18 to adequately adhere the subsequently formed material 22, while at the same time providing a relatively consistent breakdown layer 32 in the pore 18.

Figure 10:
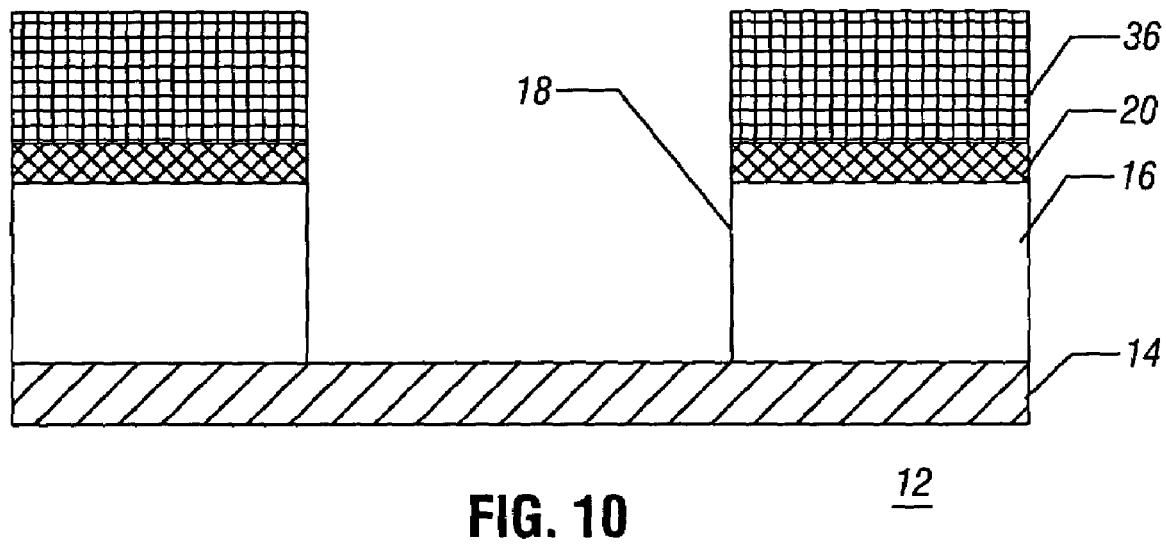
FIG. 10 is an enlarged, cross-sectional view of still another embodiment of the present invention at an early stage of manufacture.

As still another embodiment, a substrate 12 may be covered by a bottom electrode 14, in turn covered by an insulator 16, a glue layer 20, and a disposable layer 36, as shown in FIG. 10. The disposable layer 36 may be a readily removable layer such as photoresist, polyimide, or any other heat decomposing material. A pore 18 may be formed through the layers 16, 20, and 36.

Figure 11:
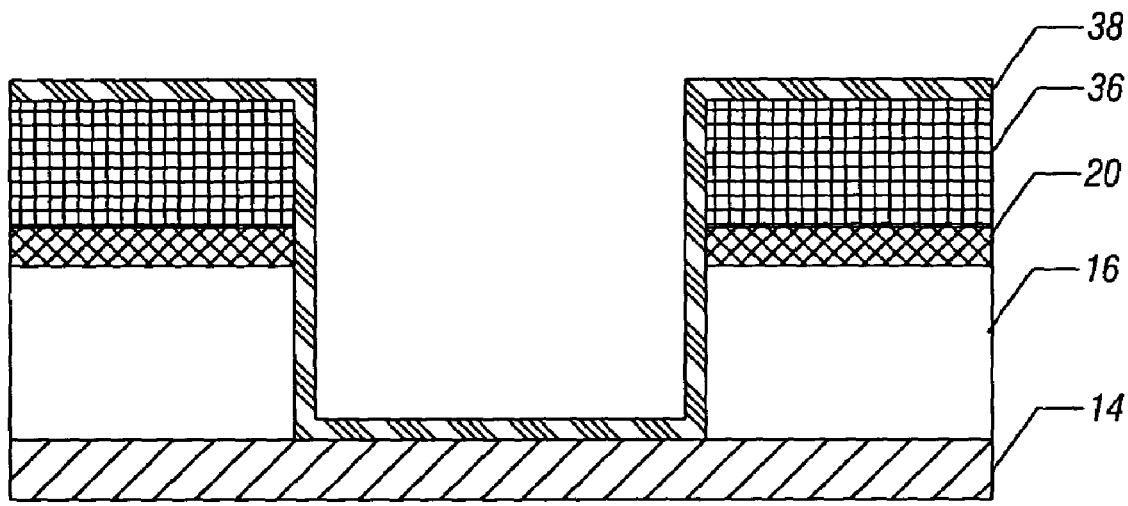
FIG. 11 is an enlarged, cross-sectional view of the embodiment shown in FIG. 10 at a subsequent stage of manufacture.

Referring to FIG. 11, the breakdown layer 38 may be formed over the structure shown in FIG. 10. The layer 38 may be formed by any suitable technique, including blanket deposition.

Then the removable layer 36 may be removed, leaving the exposed glue layer 20 and taking with it a portion of the overlying layer 38. The removal of the layer 36 may be achieved through the application of sufficient heat as one example. In effect, a liftoff of the uppermost portion of the layer 38 is achieved by removing the underlying layer 36.

Figure 12:
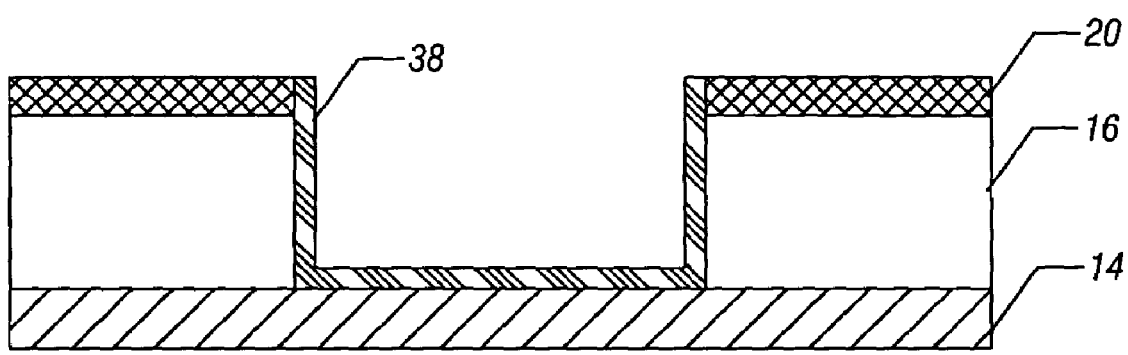
FIG. 12 is an enlarged, cross-sectional view of the embodiment shown in FIG. 11 at a subsequent stage of manufacture in accordance with one embodiment of the present invention.

In FIG. 12, the layer 38 extends to the upper edge of the glue layer 20. However, in some cases, at least a portion of a vertical extent of the layer 38 may be removed, for example, to a level below the lowest extent of a glue layer 20.

Figure 13:
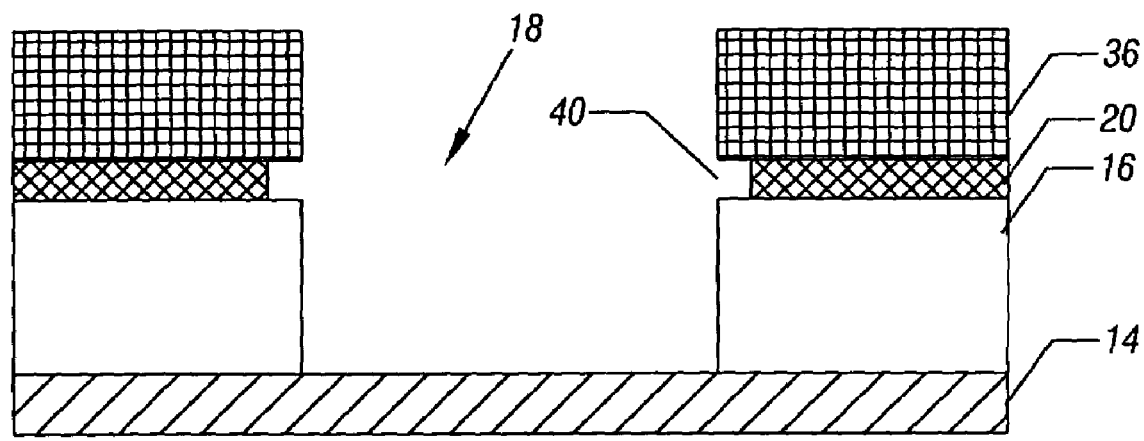
FIG. 13 is an enlarged, cross-sectional view of another embodiment of the present invention at an early stage of manufacture.

In accordance with still another embodiment of the present invention, shown in FIG. 13, the pore 18 may be defined by the insulator 16, the glue layer 20, and a disposable layer 36. However, the innermost edge 40 of the glue layer 20 may be removed. For example, the glue layer 20 may be isotropically etched or undercut in the course of forming the pore 18.

Figure 14:
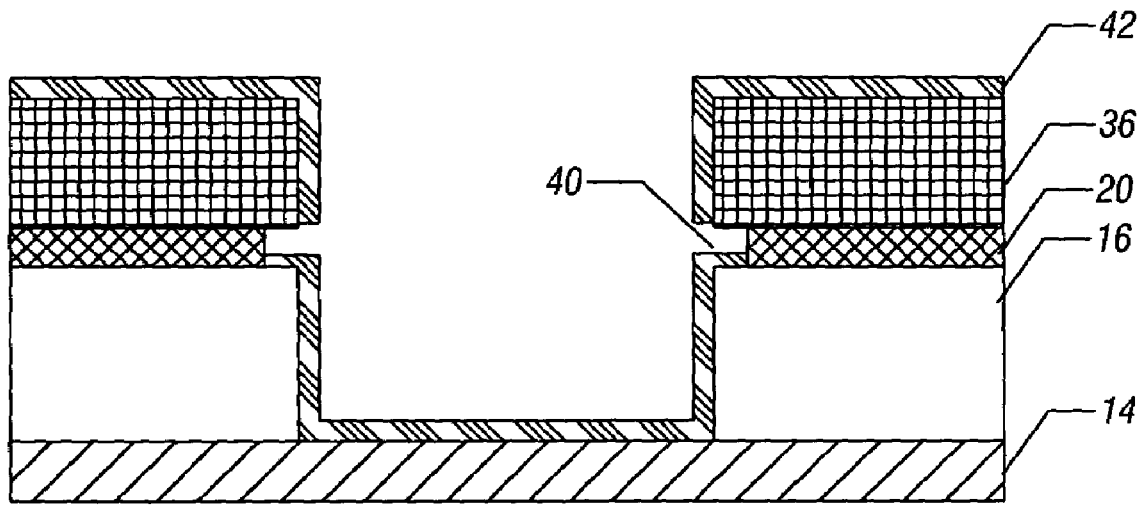
FIG. 14 is an enlarged, cross-sectional view of the embodiment shown in FIG. 13 at a subsequent stage of manufacture.

Then, as shown in FIG. 14, the breakdown layer 42 may be formed. However, because of the lateral extent of the region 40, a gap or discontinuity may be formed in the layer 42.

Figure 15:
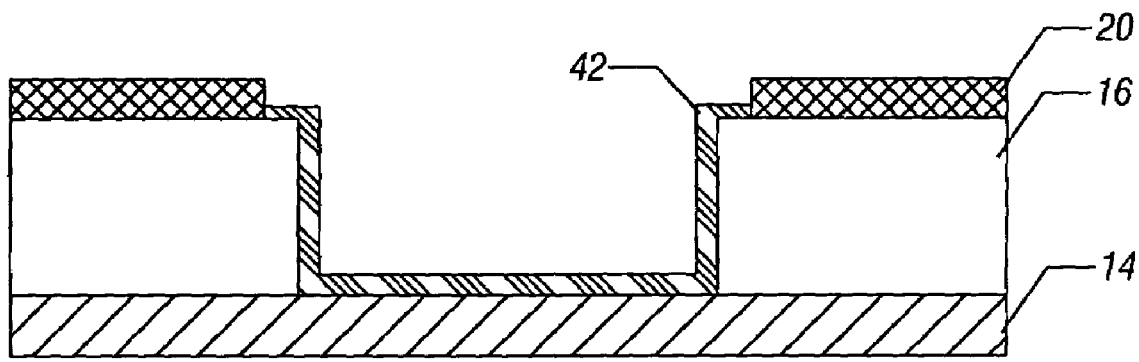
FIG. 15 is an enlarged, cross-sectional view of the embodiment shown in FIG. 14 at a subsequent stage of manufacture in accordance with one embodiment of the present invention.

Referring to FIG. 15, when the disposable layer 36 is removed, it takes with it a portion of the layer 42, which separates conveniently at the location 40. In effect, the location 40 acts as a breakaway point for the upper extent of the layer 42. This leaves the breakdown layer 42 at the level of the glue layer 20, covering the insulator 16 and the exposed portion of the electrode 14 in one embodiment. But, again, this leaves the glue layer 20 available to work to secure the subsequently formed material 22 to the insulator 16. It also avoids any issue with respect to the uniformity of the layer 42 that might arise if the layer 42 were formed prior to formation of the pore 18.

Figure 16:
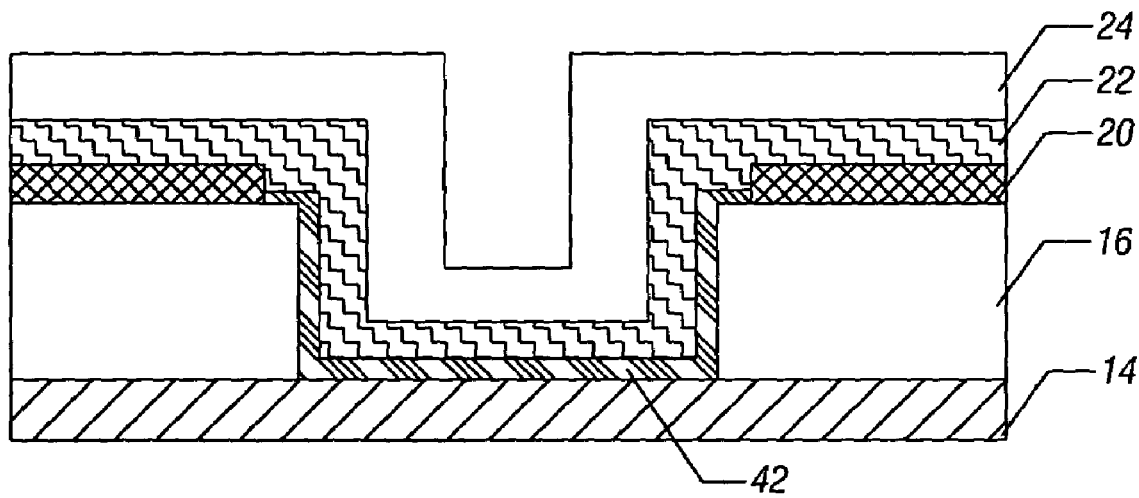
FIG. 16 is an enlarged, cross-sectional view of the embodiment shown in FIG. 15 at a subsequent stage of manufacture in accordance with one embodiment of the present invention.

As shown in FIG. 16, the material 22 and line 24 may be formed in the pore 18. The material 22 is adhered by the glue layer 20, which is self-aligned to the pore 18.

In another embodiment of the present invention, selective deposition of a breakdown layer may be utilized such that a full film thickness deposition occurs on the bottom electrode and substantially no deposition occurs on the self-aligned glue layer.

The use of a breakdown layer may simplify the process flow and reduce programming current by reducing the memory material to electrode intersection area in some embodiments. However, depositing a breakdown layer prior to the memory material deposition may significantly compromise adhesion of the memory material. Thus, in accordance with some embodiments of the present invention, the advantages of a breakdown layer may be achieved without compromising the adhesive securement of the memory material to an underlying insulator.

Figure 17:
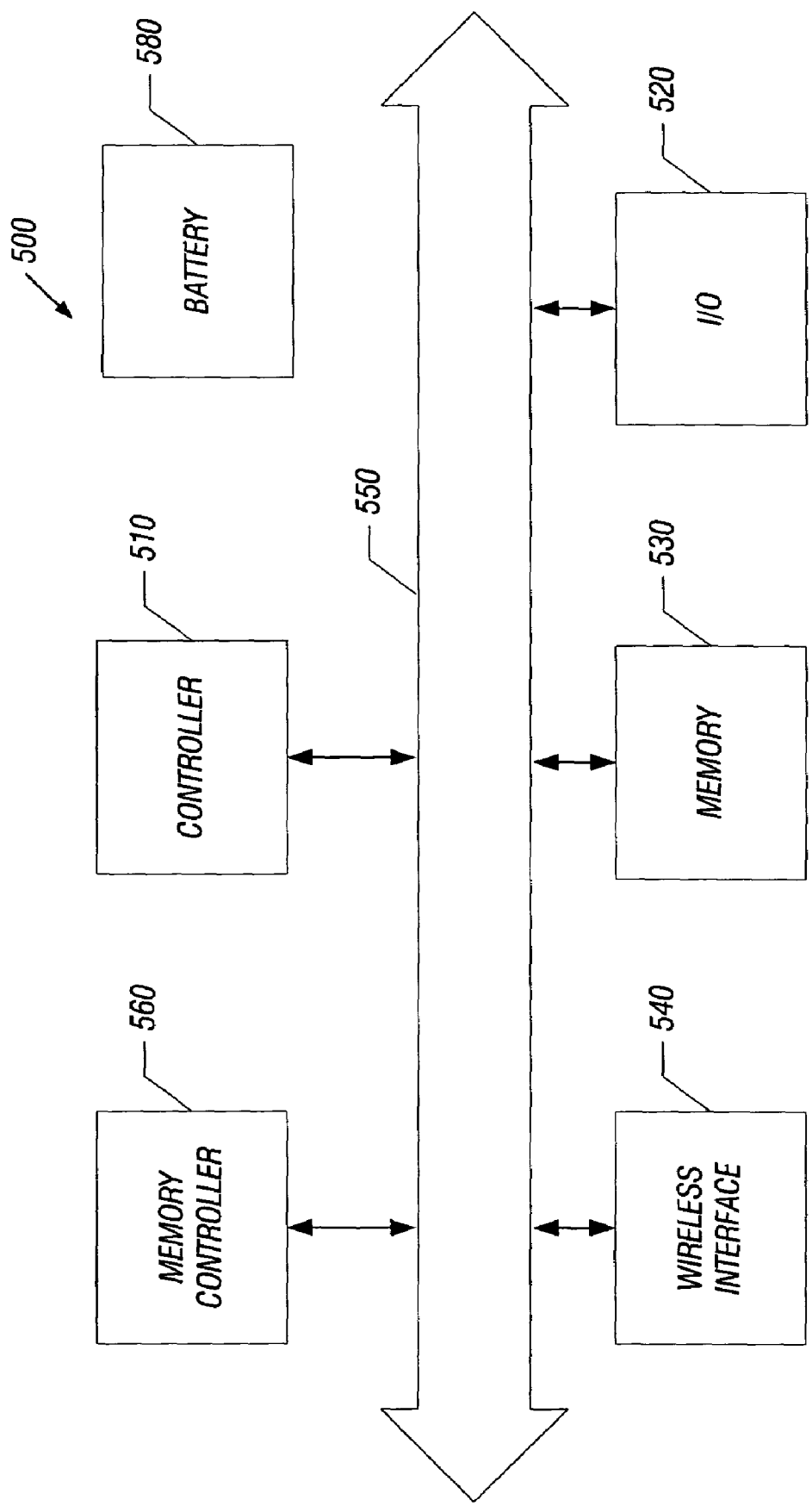
FIG. 17 is a system depiction of one embodiment of the present invention.

Turning to FIG. 17, a portion of a system 500 in accordance with another embodiment of the present invention is described. The system 500 may be used in a portable device such as, for example, a smart card, a personal digital assistant, a web tablet, a wireless telephone, a pager, an instant messaging device, a digital music player, or a digital camera, to mention a few examples. In such applications, a phase change memory may contribute to reduced system power requirements compared to using other non-volatile memories. This may be particularly useful in battery powered applications.

The system 50 may be adapted to transmit and/or receive information wirelessly. The system 500 may be used in any of the following systems: a wireless local network system, a wireless personal area network system, or a cellular network, although the scope of the present invention is not limited in this respect.

The system 500 may include a controller 510, an input/output device 520 (e.g., a keypad display), a memory 530, and a wireless interface 540 coupled to each other via bus 550. A battery power receptacle 580 may also be coupled to power the components of the system 500. It should be noted that the scope of the present invention is not limited to embodiments having any or all of these components.

The controller 510 may comprise, for example, one or more microprocessors, digital signal processors, microcontrollers, or the like. The memory 530 may be used to store messages transmitted to or by the system 500. The memory 530 may also optionally be used to store instructions that are executed by the controller 510 during the operation of the system 500, may be used to store user data. The memory 530 may be provided by one or more different types of memory. For example, the memory 530 may comprise a volatile memory (any type of random access memory), a non-volatile memory, such a flash memory, and/or phase change memory that includes a memory element such as, for example, the cell 10, illustrated in FIG. 1.

The input/output device 520 may be used to generate a message. The system 500 may use the wireless interface 540 to transmit and receive messages to and from a wireless communication network with a radio frequency signal. Examples of the wireless interface 540 may include an antenna, or a wireless transceiver, such as a dipole antenna, although the scope of the present invention is not limited in this respect.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:
   using a conductive layer to adhere a phase change material to an insulator; and
   forming a dielectric layer between the phase change material and an electrode such that current between the phase change material and the electrode must pass through said dielectric layer.

2. The method of claim 1 including forming the insulator over said electrode and forming a pore in said insulator down to said electrode.

3. The method of claim 2 including forming said conductive layer over said insulator and forming said pore through said conductive layer and said insulator.

4. The method of claim 3 including forming said dielectric layer in said pore over said conductive layer.

5. The method of claim 4 including removing the portion of said dielectric layer over said conductive layer.

6. The method of claim 5 including using selective etching to remove said conductive layer.

7. The method of claim 5 including using a lift-off technique to remove said conductive layer.

8. The method of claim 1 including forming an upper electrode over said phase change material and forming a breakdown channel through said dielectric layer.

9. The method of claim 1 including selectively depositing said dielectric layer on said electrode.

10. The method of claim 1 including forming said dielectric layer over said electrode, depositing an etch stop layer over said dielectric layer, forming the insulator over said etch stop layer, and forming said conductive layer over said insulating layer.

11. The method of claim 10 including forming said pore through said conductive layer and said insulator down to said etch stop layer.

12. The method of claim 11 including selectively removing the exposed portion of said etch stop layer over said dielectric layer.

13. A phase change memory comprising:
    a substrate;
    an electrode on said substrate;
    an insulator having a pore formed therein over said substrate, said pore extending to said electrode;
    a conductive layer over said insulator;
    a phase change material adhered to said insulator by said conductive layer, said phase change material in said pore; and
    a dielectric layer between said phase change material and said electrode such that current between the phase change material and the electrode must pass through said dielectric layer.

14. The memory of claim 13 including a breakdown channel in said dielectric material.

15. The memory of claim 13 wherein said dielectric layer is substantially planar.

16. The memory of claim 13 wherein said dielectric layer is generally u-shaped and lines said pore.

17. The memory of claim 13 wherein said conductive layer includes titanium.

18. A system comprising:
    a substrate;
    a phase change memory formed on the substrate, said memory including an electrode on said substrate and the insulator having a pore formed therein over said substrate, said pore extending to said electrode, a conductive layer over said insulator, a phase change material adhered to said insulator by said conductive layer, said phase change material in said pore and a dielectric layer between said phase change material and said electrode such that current between the phase change material and the electrode must pass through said dielectric layer; and
    a battery receptacle coupled to said phase change memory.

19. The system of claim 18 including a breakdown channel in said dielectric material.

20. The system of claim 18 wherein said dielectric layer is substantially planar.

21. The system of claim 18 wherein said dielectric layer is generally U-shaped and lines said pore.

22. The system of claim 18 wherein conductive layer includes titanium.

23. The system of claim 18 including a processor coupled to said memory.

* * * * *